United States Patent
Ryu et al.

(10) Patent No.: US 10,818,474 B1
(45) Date of Patent: Oct. 27, 2020

(54) RF GENERATOR AND ITS OPERATING METHOD

(71) Applicant: Newpowerplasma Co., Ltd., Pyoungtak-si, Gyeonggi-do (KR)

(72) Inventors: Seunghee Ryu, Gunpo-si (KR); Soonsang Hwang, Hwaseong-si (KR); Younghee Jang, Osan-si (KR)

(73) Assignee: NEWPOWERPLASMA CO., LTD., Pyoungtak-si, Gyeonggi-do (KR)

( * ) Notice: Subject to any disclaimer, the term of this patent is extended or adjusted under 35 U.S.C. 154(b) by 0 days.

(21) Appl. No.: 16/421,734

(22) Filed: May 24, 2019

(30) Foreign Application Priority Data

May 8, 2019 (KR) .......................... 10-2019-0053516

(51) Int. Cl.
| | |
|---|---|
| *H02M 1/08* | (2006.01) |
| *H01J 37/32* | (2006.01) |
| *H02M 7/5395* | (2006.01) |
| *H02M 1/00* | (2006.01) |
| *H02M 1/44* | (2007.01) |

(52) U.S. Cl.
CPC ......... *H01J 37/32146* (2013.01); *H02M 1/08* (2013.01); *H02M 7/5395* (2013.01); *H02M 1/44* (2013.01); *H02M 2001/007* (2013.01)

(58) Field of Classification Search
CPC ............ H02M 1/08; H02M 1/02; H02M 1/44; H02M 7/539; H02M 7/525; H02M 7/5395; H02M 2001/007; H05B 37/02; H01J 37/321; H01J 37/32146
See application file for complete search history.

(56) References Cited

U.S. PATENT DOCUMENTS

| | | | | |
|---|---|---|---|---|
| 6,281,642 | B1* | 8/2001 | Konishi | H05B 47/20 315/308 |
| 6,522,089 | B1* | 2/2003 | Duong | H05B 41/2928 315/291 |
| 9,006,988 | B2* | 4/2015 | Zhang | H05B 41/042 315/209 R |
| 9,313,844 | B2* | 4/2016 | Nakajo | H05B 45/37 |
| 2015/0180346 | A1* | 6/2015 | Yuzurihara | H01J 37/32027 315/127 |

(Continued)

FOREIGN PATENT DOCUMENTS

| | | |
|---|---|---|
| KR | 10-1579416 B1 | 12/2015 |
| KR | 10-1609107 B1 | 4/2016 |

*Primary Examiner* — Thai Pham
(74) *Attorney, Agent, or Firm* — Rabin & Berdo, P.C.

(57) ABSTRACT

Disclosed herein is an RF generator that includes an inverter including first and second switching elements controlled by a PWM control signal and converting a DC voltage having a predetermined level outputted from the DC/DC converter into an AC voltage having a predetermined level, an LC filter that outputs a sine wave resonance signal having a predetermined resonance frequency from a high frequency signal, a transformer that induces a high frequency power signal of a pulse waveform outputted from the LC filter to a secondary side, an ignition module that sets a switching frequency at the termination of an ignition mode as an ignition mode escape frequency, an operation module that applies the ignition mode escape frequency as an initial value of a switching frequency in an operation mode, and a signal controller that generates the PWM control signal by using the switching frequency.

6 Claims, 7 Drawing Sheets

(56) References Cited

U.S. PATENT DOCUMENTS

| 2015/0195896 A1* | 7/2015 | Yuzurihara | H05H 1/46 |
| | | | 315/111.21 |
| 2015/0250046 A1* | 9/2015 | Habu | H05H 1/46 |
| | | | 315/111.21 |
| 2018/0249570 A1* | 8/2018 | Yuzurihara | H01J 37/32174 |

* cited by examiner

RF GENERATOR AND ITS OPERATING METHOD

TECHNICAL FIELD

The present disclosure relates to an RF generator, and more particularly, to an RF generator and an operating method thereof.

BACKGROUND ART

In general, an RF generator separately performs an operation for generating plasma in a load (for example, a plasma chamber) in an ignition mode and a steady state mode. Accordingly, at the time of transition from the ignition mode to the steady state mode, since an operation frequency at the termination of the ignition mode and an operation frequency at the start of the steady state mode are different from each other, the output frequency of the RF generator is transiently unstable.

However, in an RF generator with the output power of less than 100 watts, the instability of the output frequency in such a transient state has a great influence on the yield in the load.

Furthermore, as illustrated in FIG. 1, when a ringing phenomenon (a phenomenon that a waveform is distorted in some sections A1 and A2) occurs in the output voltage waveform of the ultra low power RF generator, there is a high possibility that sparks occur in an upper electrode of the plasma chamber as the load. When the sparks occurring in the upper electrode of the plasma chamber fall on a wafer in the chamber, the wafer as a defect needs to be discarded, which has a great influence on the yield. However, it is understood that the ringing phenomenon occurring in the output voltage waveform is caused by resonance due to a combination of leakage inductance of a transformer disposed in the RF generator and the plasma chamber as the capacitive load. On the other hand, since the output power of the RF generator required by the plasma chamber is frequently changed depending on the load condition, it is particularly difficult to control the output power.

Therefore, it is necessary to very precisely control the output frequency and the output voltage waveform in the ultra low power RF generator.

Korean Patent No. 10-1579416 entitled DC Power supply and Control Method thereof Korean Patent No. 10-1609107 DC Power supply and Control Method thereof

DISCLOSURE

Technical Problem

Accordingly, the present invention has been made keeping in mind the above problems occurring in the related art, and an object of the present invention is to provide an RF generator capable of preventing a transient phenomenon of an output current and an operating method thereof.

Furthermore, another object of the present invention is to provide an RF generator capable of preventing a ringing phenomenon of an output current waveform and an operating method thereof.

Furthermore, further another object of the present invention is to provide an RF generator capable of precisely controlling an output current and an operating method thereof.

Technical Solution

An RF generator according to an aspect of the present invention includes: a rectifier configured to rectify an AC voltage of a commercial power supply into a DC voltage and output the DC voltage; a DC/DC converter configured to convert the DC voltage outputted from the rectifier into a second DC voltage; an inverter including first and second switching elements controlled by a PWM control signal and operating alternately, and configured to convert a DC voltage having a predetermined level outputted from the DC/DC converter into an AC voltage having a predetermined level; an LC filter including an inductor and capacitors coupled in series and parallel at an output terminal of the inverter, and configured to output a sine wave resonance signal having a predetermined resonance frequency from a high frequency signal outputted from the inverter; a transformer configured to induce a high frequency power signal of a pulse waveform outputted from the LC filter to a secondary side; an ignition module configured to terminate an ignition mode when a high frequency load detection current is larger than an ignition load setting current, set a switching frequency at the termination of the ignition mode as an ignition mode escape frequency, and output a mode selection signal; an operation module configured to apply the ignition mode escape frequency, which is outputted from the ignition module, as an initial value of a switching frequency in an operation mode; and a signal controller configured to generate the PWM control signal by using the switching frequency.

Preferably, the RF generator may further include a selector configured to select the switching frequency outputted from the ignition module in the ignition mode and select the switching frequency outputted from the operation module in the operation mode by being controlled by the mode selection signal at the termination of the ignition mode.

Preferably, the RF generator may further include a ringing removal unit connected in parallel to the secondary side of the transformer, and configured to remove a ringing phenomenon occurring in a high frequency load current waveform due to a resonance phenomenon of a leakage inductance component existing on the secondary side of the transformer and a parasitic capacitance component parasitic to a high frequency load.

Preferably, the ringing removal unit may be composed of a capacitor, or a resistor and a capacitor connected in series.

Preferably, the signal controller may receive the high frequency load detection current and output a state signal to display a state of the high frequency load detection current, and the RF generator may further include an indicator configured to display the state of the high frequency load detection current in response to the state signal.

Furthermore, an RF generator according to another aspect of the present invention includes: a rectifier configured to rectify an AC voltage of a commercial power supply into a DC voltage and output the DC voltage; a DC/DC converter configured to convert the DC voltage outputted from the rectifier into a second DC voltage; an inverter including first and second switching elements controlled by a PWM control signal and operating alternately, and configured to convert a DC voltage having a predetermined level outputted from the DC/DC converter into an AC voltage having a predetermined level; an LC filter including an inductor and capacitors coupled in series and parallel at an output terminal of the inverter, and configured to output a sine wave resonance signal having a predetermined resonance frequency from a high frequency signal outputted from the inverter; a transformer configured to induce a high frequency power signal of a pulse waveform outputted from the LC filter to a secondary side; and a signal controller configured to generate the PWM control signal by using a high frequency load detection current and a high frequency load detection voltage of a high frequency load side.

Furthermore, an operating method of an RF generator operating in an ignition mode and an operation mode according to further another aspect of the present invention includes: a first step in which the RF generator enters the ignition mode; a second step in which an ignition module compares a high frequency load detection current detected at a high frequency load side with an ignition load setting current; a third step in which the ignition module compares a high frequency load detection voltage detected at the high frequency load side with an ignition load setting voltage when the high frequency load detection current is smaller than the ignition load setting current; a fourth step in which the ignition module terminates the ignition mode and sets a switching frequency at the termination of the ignition mode as an ignition mode escape frequency when the high frequency load detection current is equal to or larger than the ignition load setting current; a fifth step in which the ignition module reduces the switching frequency by a predetermined frequency and returns to the second step when the high frequency load detection voltage is smaller than the ignition load setting voltage; a sixth step in which the ignition module returns to the second step while maintaining the switching frequency as is when the high frequency load detection voltage is larger than the ignition load setting voltage; and a seventh step in which an operation module applies the ignition mode escape frequency as an initial value of a switching frequency in the operation mode, and generates the switching frequency by using the high frequency load detection current and a high frequency load setting current inputted from an exterior.

Advantageous Effects

In accordance with the RF generator of the present invention, it is possible to significantly improve the yield in a high frequency chamber as a load by preventing the transient phenomenon of an output current at the time of transition from an ignition mode to a steady state mode and preventing a ringing phenomenon in an output current waveform.

MODE FOR INVENTION

Hereafter, specific embodiments of the present invention will be described with reference to the accompanying drawings. However, the present invention is not intended to be limited to specific embodiments and should be construed to include all modifications, equivalents, and alternatives included in the spirit and scope of the present invention.

Figure 2:
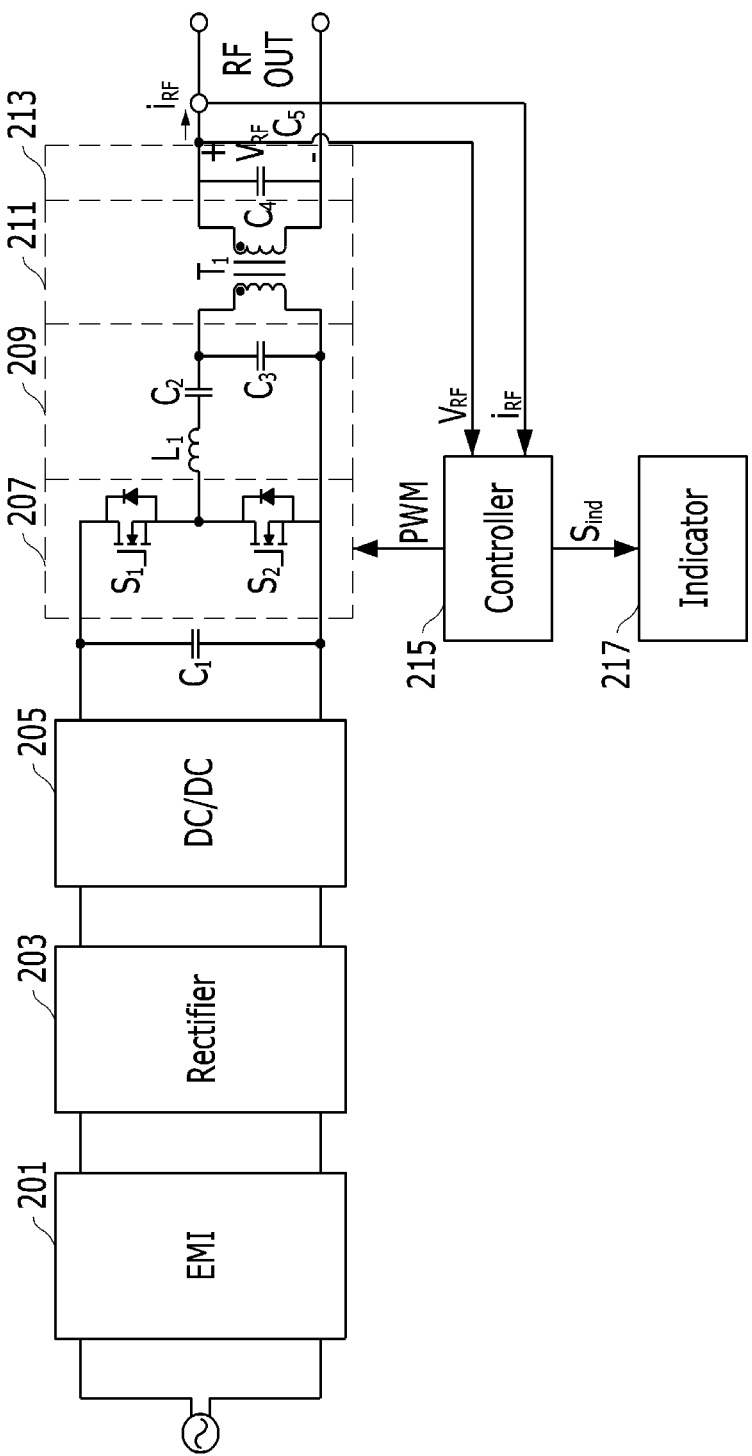
FIG. 2 is a block diagram illustrating an RF generator according to an embodiment of the present invention.

FIG. 2 is a block diagram illustrating an RF generator according to an embodiment of the present invention.

The RF generator according to the embodiment of the present invention includes an EMI filter (EMI) 201, a rectifier 203, a DC/DC converter (DC/DC) 205, an inverter 207, an LC filter 209, a transformer 211, a ringing removal unit 213, a signal controller (Controller) 215, and an indicator 217.

The EMI 201 performs a function of shielding noise of an electromagnetic wave included in applied single-phase AC power.

The rectifier 203 rectifies an AC voltage of a commercial power supply into a DC voltage and outputs the DC voltage.

The DC/DC 205 converts the DC voltage outputted from the rectifier 203 into a second DC voltage. The second DC voltage may be a voltage having various levels.

The inverter 207 converts a DC voltage having a predetermined level outputted from the DC/DC 205 into an AC voltage having a predetermined level by using switching elements S1 and S2 controlled by a PWM control signal. The first switch S1 and the second switch S2 in the inverter 207 operate alternately.

The LC filter 209 includes an inductor and capacitors coupled in series and parallel, and outputs a sine wave resonance signal having a predetermined resonance frequency from a high frequency signal outputted from the inverter 207. In accordance with an embodiment, the resonance frequency of the resonance signal may be 13.56 MHz.

The transformer 211 induces a high frequency power signal of a pulse waveform outputted from the LC filter 209 to a secondary side and electrically insulates a primary side and the secondary side, so that it is possible to prevent an electric shock accident that may occur when a user contacts a plasma chamber included in an RF load.

Figure 1:
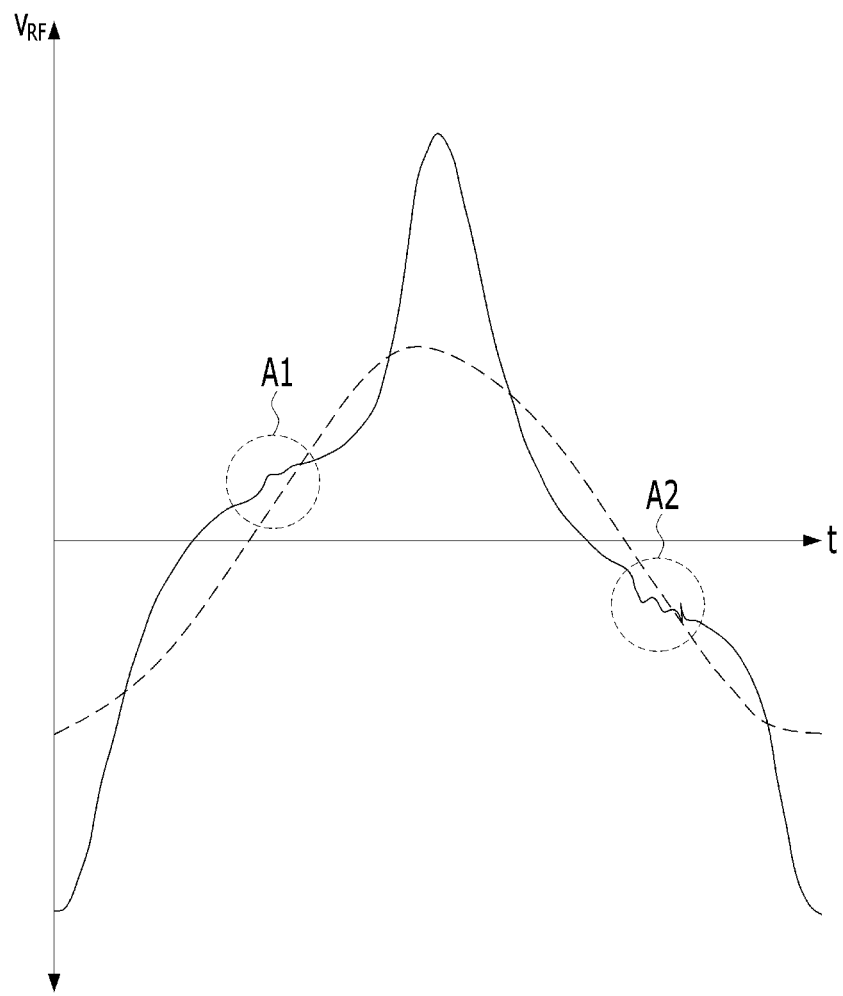
FIG. 1 is a diagram illustrating an output voltage waveform in the related art.
Figure 3:
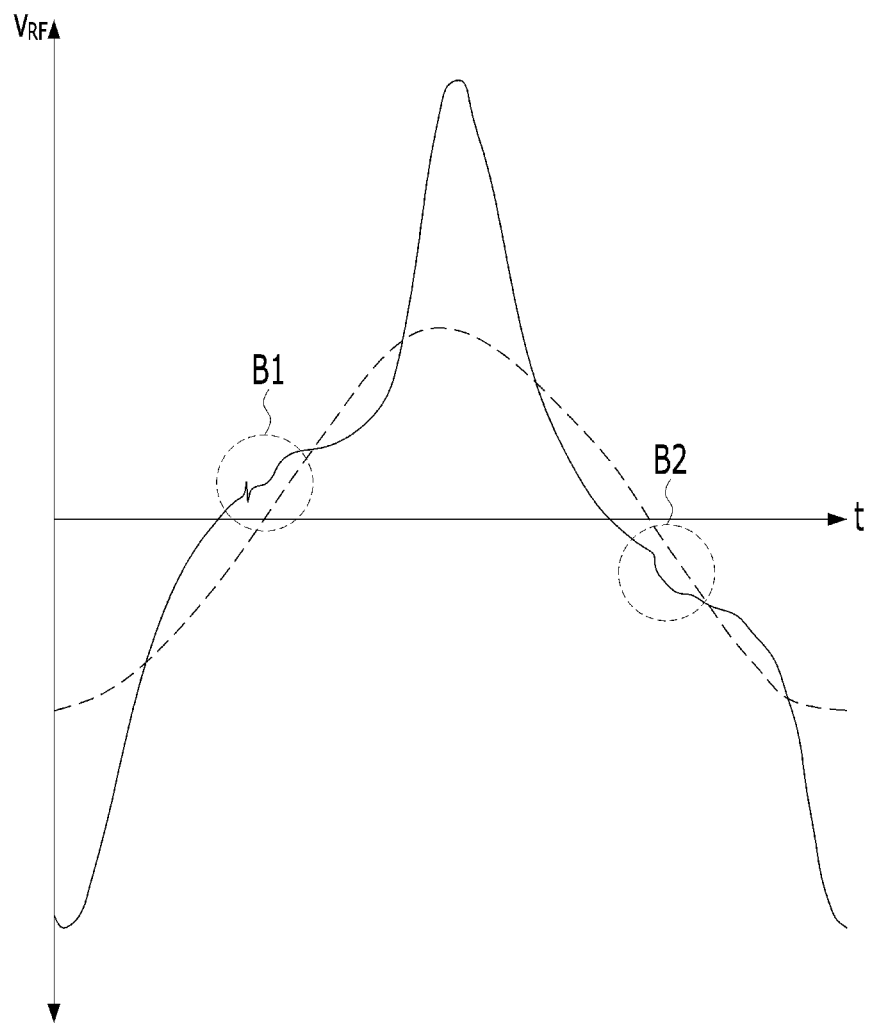
FIG. 3 is a diagram illustrating an output voltage waveform according to an embodiment of the present invention.

The ringing removal unit 213 includes a capacitor C4 connected in parallel to the secondary side of the transformer 211. The ringing removal unit 213 can remove a ringing phenomenon occurring in a high frequency load current waveform due to a resonance phenomenon of a leakage inductance component existing on the secondary side of the transformer 211 and a parasitic capacitance component parasitic to a high frequency load. That is, as compared with FIG. 1, it can be seen that the ringing phenomenon disappears in a region B1 and a region B2 as illustrated in FIG. 3. Furthermore, since the capacitor C4 of the ringing removal unit 213 is expressed by $C=C4/n^2$ when viewed at the primary side of the transformer 211, it is possible to significantly improve a resonance gain of the LC filter 209 even though a small-capacity capacitor is used.

The Controller 215 receives a high frequency load detection current iRF and a high frequency load detection voltage vRF of the high frequency load side, generates the PWM control signal, outputs the PWM control signal to the inverter 207, and outputs a state signal Sind to the indicator 217 to display the state of the high frequency load detection current iRF.

The indicator 217 displays the state of the high frequency load detection current iRF by using the state signal Sind outputted from the Controller 215.

Figure 4:
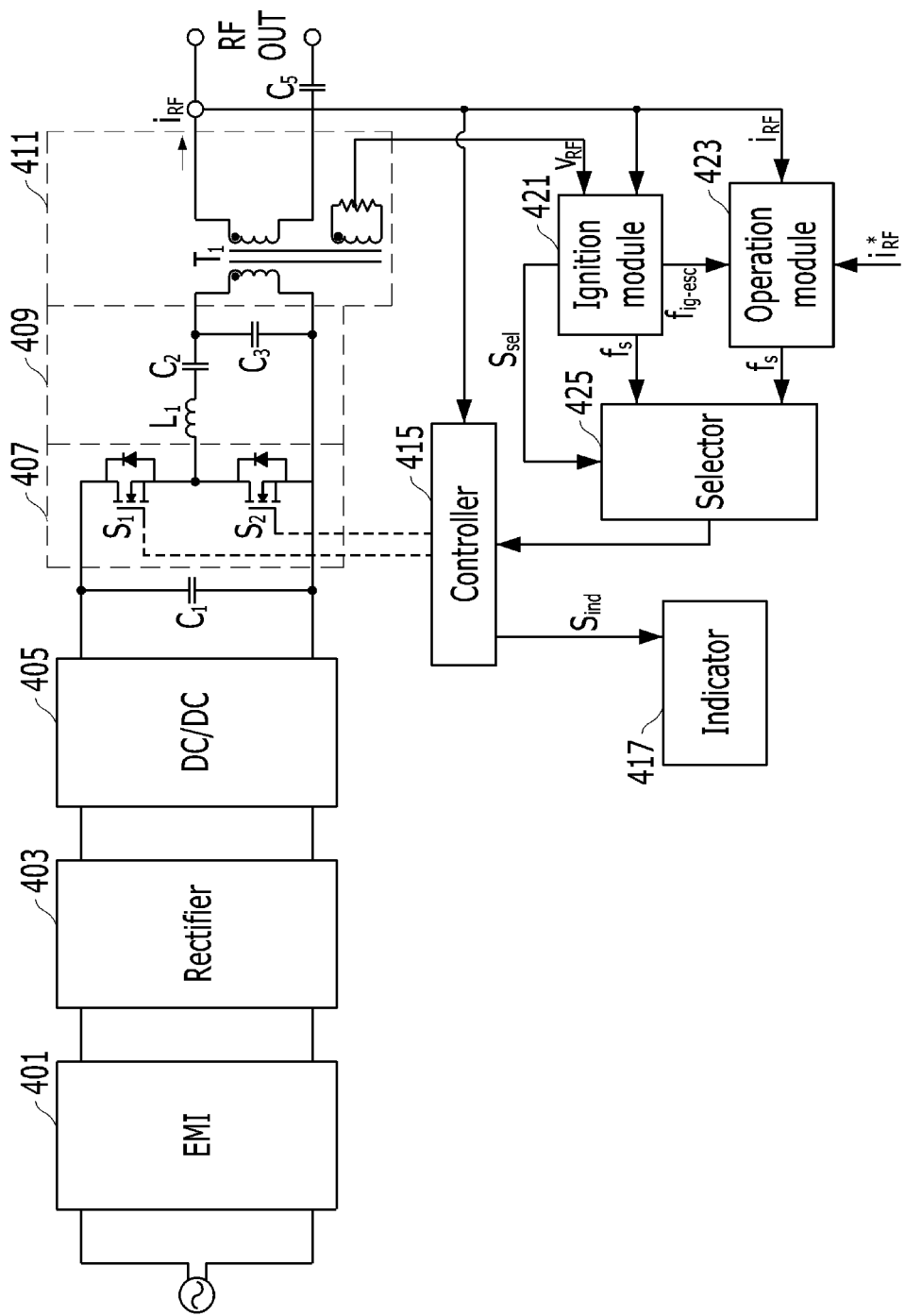
FIG. 4 is a block diagram illustrating an RF generator according to another embodiment of the present invention.

FIG. 4 is a block diagram illustrating an RF generator according to another embodiment of the present invention.

The RF generator according to another embodiment of the present invention includes an EMI filter (EMI) 401, a rectifier 403, a DC/DC converter (DC/DC) 405, an inverter 407, an LC filter 409, a transformer 411, a signal controller (Controller) 415, an indicator 417, an ignition module 421, an operation module 423, and a selector 425.

Since the configurations and functions of the EMI 401, the rectifier 403, the DC/DC 405, the inverter 407, the LC filter 409, the transformer 411, and the indicator 417 according to another embodiment of the present invention illustrated in FIG. 4 are the same as those of the EMI 201, the Rectifier 203, the DC/DC 205, the inverter 207, the LC filter 209, the transformer 211, and the indicator 217, which are illustrated in FIG. 2, a description thereof is omitted.

The ignition module 421 receives the high frequency load detection current iRF and the high frequency load detection voltage vRF of the high frequency load side, and reduces a switching frequency fs by a predetermined frequency at predetermined intervals until the switching frequency fs reaches from a predetermined ignition mode start frequency fig_st to a predetermined ignition mode stop frequency fig_sp, in an ignition mode. When the high frequency load detection current iRF is smaller than an ignition load setting current iRF_ignition, the ignition module 421 reduces the switching frequency fs. When the high frequency load detection current iRF is equal to or larger than the ignition load setting current iRF_ignition, the ignition module 421 terminates the ignition mode and outputs a mode selection signal Ssel. Furthermore, the ignition module 421 sets the switching frequency fs at the termination of the ignition mode as an ignition mode escape frequency fig_esc, and outputs the ignition mode escape frequency fig_esc.

The operation module 423 applies the ignition mode escape frequency fig_esc, which is outputted from the ignition module 421, as an initial value of a switching frequency fs in an operation mode, and then generates and outputs a switching frequency fs by using the high frequency load detection current iRF and a high frequency load setting current $i^*_{RF}$ inputted from an exterior.

The selector 425 selects the switching frequency fs outputted from the ignition module 421 in the ignition mode, and selects the switching frequency fs outputted from the operation module 423 in the operation mode by being controlled by the mode selection signal Ssel outputted from the ignition module 421 at the termination of the ignition mode.

The Controller 415 generates a PWM control signal by using the switching frequency fs outputted from the selector 425, outputs the PWM control signal to the inverter 407, receives the high frequency load detection current iRF, and outputs a state signal Sind to the indicator 417 to display the state of the high frequency load detection current iRF.

Figure 5:
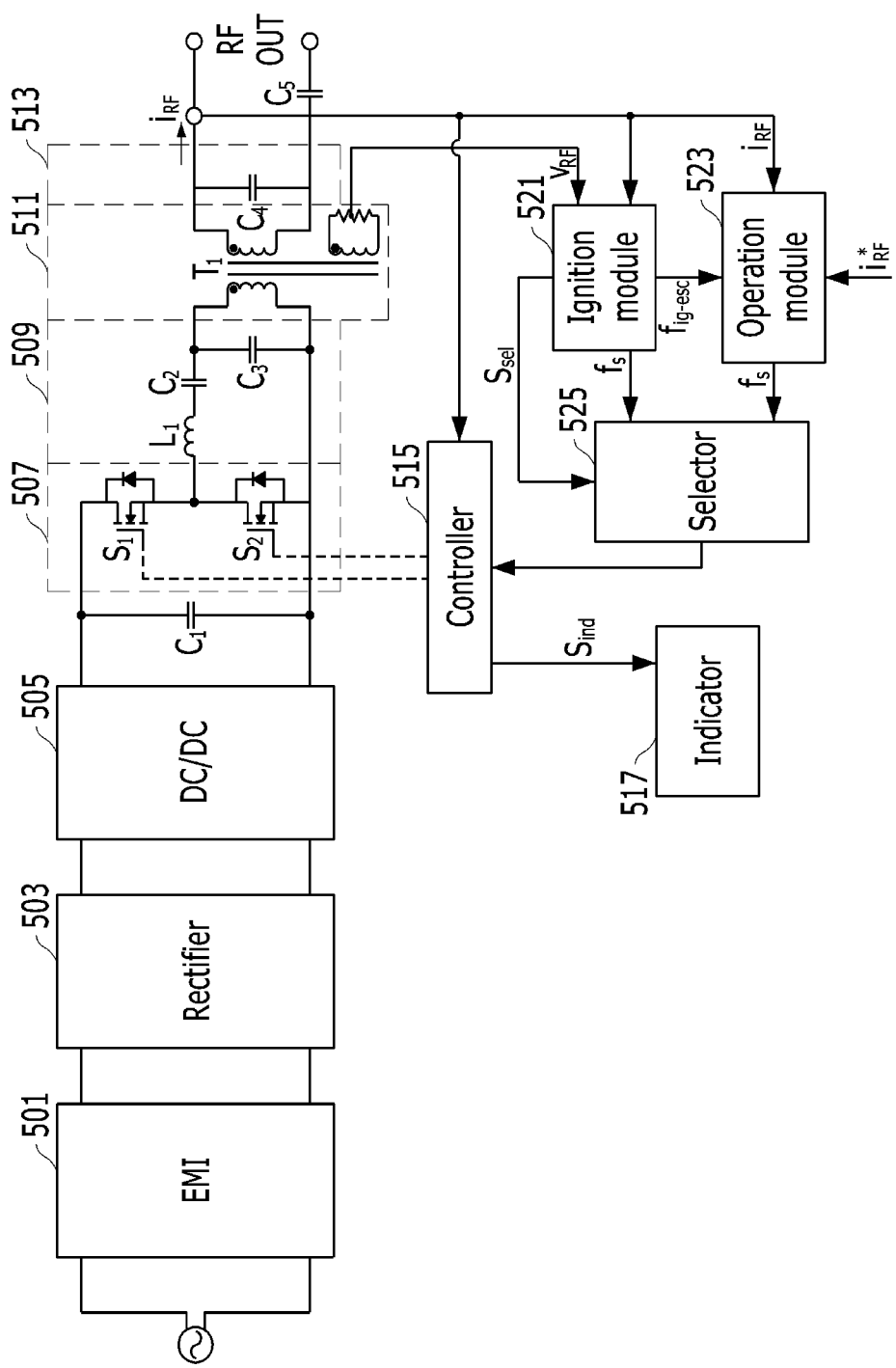
FIG. 5 is a block diagram illustrating an RF generator according to further another embodiment of the present invention.

FIG. 5 is a block diagram illustrating an RF generator according to further another embodiment of the present invention.

The RF generator according to further another embodiment of the present invention includes an EMI filter (EMI) 501, a Rectifier 503, a DC/DC converter (DC/DC) 505, an inverter 507, an LC filter 509, a transformer 511, a ringing removal unit 513, a signal controller (Controller) 515, an indicator 517, an ignition module 521, an operation module 523, and a selector 525.

That is, the RF generator according to further another embodiment of the present invention, which is illustrated in FIG. 5, is obtained by adding the ringing removal unit 513 to the RF generator according to further another embodiment of the present invention, which is illustrated in FIG. 4.

Figure 6:
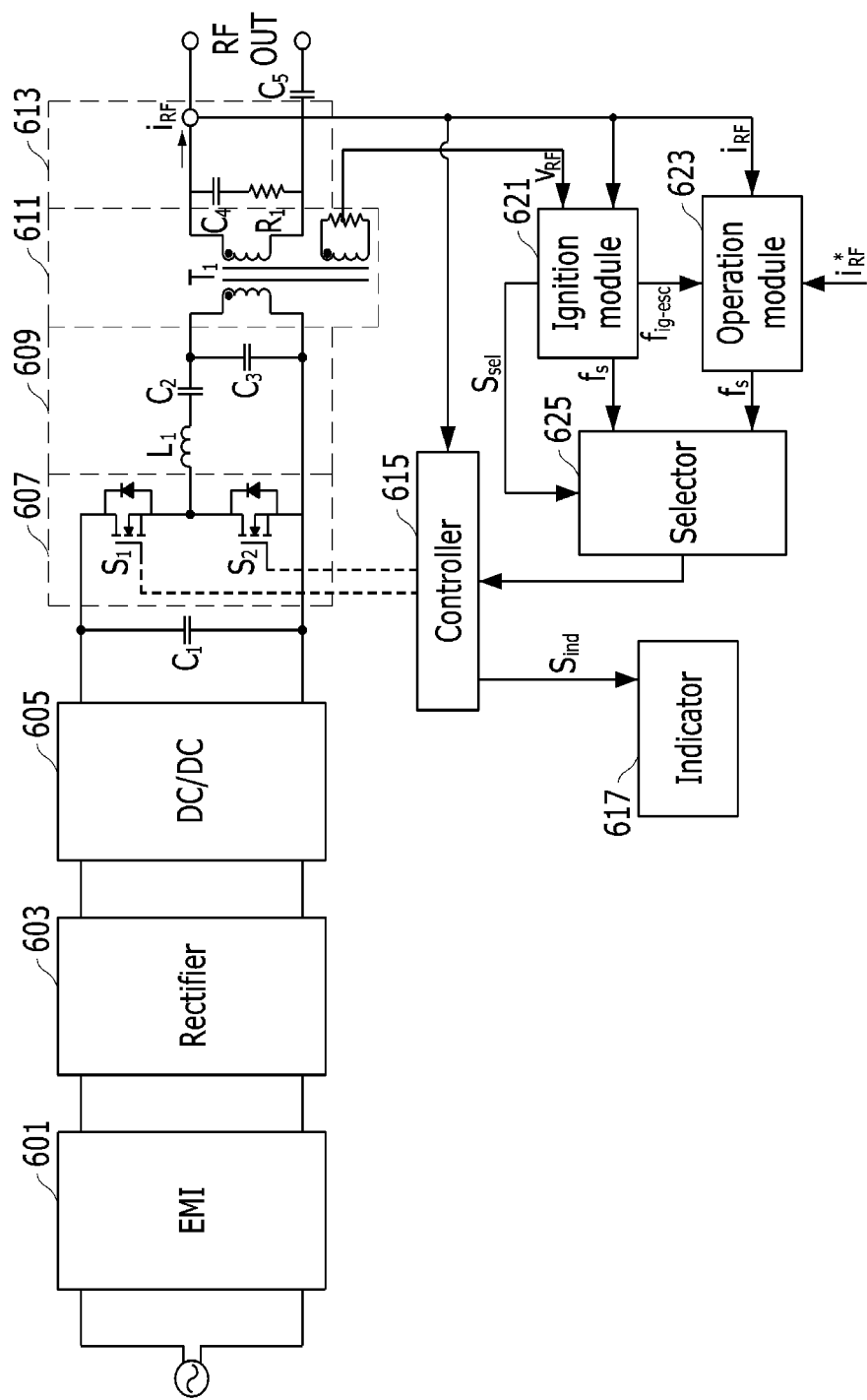
FIG. 6 is a block diagram illustrating an RF generator according to still another embodiment of the present invention.

FIG. 6 is a block diagram illustrating an RF generator according to still another embodiment of the present invention.

The RF generator according to still another embodiment of the present invention, which is illustrated in FIG. 6, includes an EMI filter (EMI) 601, a rectifier 603, a DC/DC converter (DC/DC) 605, an inverter 607, an LC filter 609, a transformer 611, a ringing removal unit 613, a signal controller (Controller) 615, an indicator 617, an ignition module 621, an operation module 623, and a selector 625.

That is, the RF generator according to still another embodiment of the present invention, which is illustrated in FIG. 6, is different from the RF generator according to further another embodiment of the present invention, which is illustrated in FIG. 5, in that a ringing removal unit 613 composed of a resistor and a capacitor connected in series is applied instead of the ringing removal unit 513 composed of only a capacitor.

It is more effective to construct the ringing removal unit with a resistor and a capacitor connected in series instead of only a capacitor.

Figure 7:
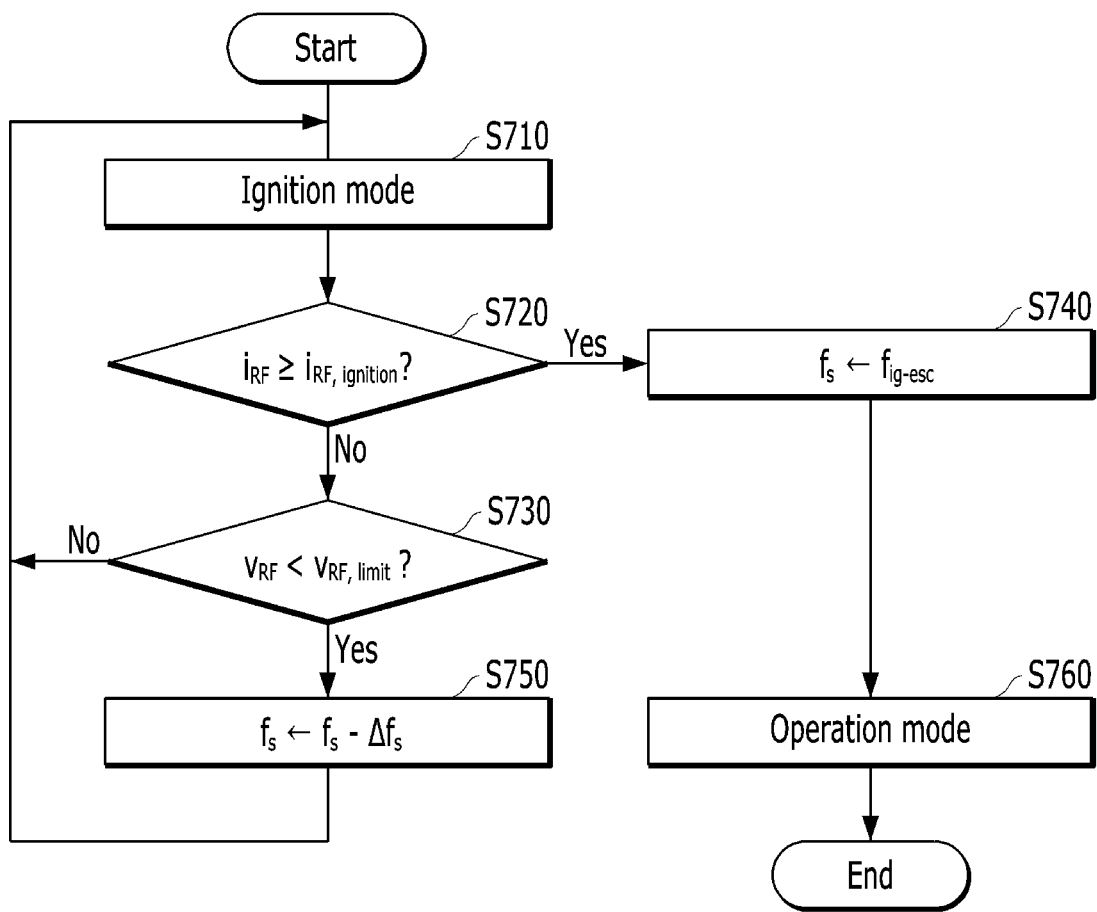
FIG. 7 is a control flowchart of an RF generator according to an embodiment of the present invention.

FIG. 7 is a control flowchart of an RF generator according to an embodiment of the present invention.

When the RF generator according to the embodiment of the present invention enters the ignition mode for high frequency control (S710), the ignition module 421, 521, or 621 compares the high frequency load detection current iRF with the ignition load setting current iRF_ignition (S720).

When the high frequency load detection current iRF is smaller than the ignition load setting current iRF_ignition, the ignition module 421, 521, or 621 compares the high frequency load detection voltage vRF with an ignition load setting voltage vRF_limit (S730).

When the high frequency load detection current iRF is equal to or larger than the ignition load setting current iRF_ignition, the ignition module 421, 521, or 621 terminates the ignition mode and sets a switching frequency at the termination of the ignition mode as the ignition mode escape frequency fig_esc (S740).

When the high frequency load detection voltage vRF is smaller than the ignition load setting voltage vRF_limit, the ignition module 421, 521, or 621 reduces the switching frequency fs by a predetermined frequency Δfs (S750), and returns to step S710.

When the high frequency load detection voltage vRF is equal to or larger than the ignition load setting voltage vRF_limit, the ignition module 421, 521, or 621 returns to step S710 while maintaining the switching frequency fs as is.

The operation module 423, 523, or 623 applies the ignition mode escape frequency fig_esc as the initial value of the switching frequency fs in the operation mode, and generates and outputs the switching frequency fs by using the high frequency load detection current iRF and the high frequency load setting current $i^*_{RF}$ inputted from an exterior (S760).

Various modifications of the invention disclosed above can be made within the scope not impairing the basic spirit. That is, all the above embodiments should be construed to be illustrative, not limitative. Accordingly, the scope of the protection of the present invention should be defined according to the accompanying claims, not the above embodiments, and when elements defined in the accompanying claims are replaced with equivalents thereto, it should be deemed that the equivalents fall within the scope of the protection of the present invention.

DESCRIPTION OF REFERENCE NUMERALS
OF IMPORTANT PARTS 201, 401, 501, 601: EMI filter
203, 403, 503, 603: rectifier
205, 405, 505, 605: DC/DC converter
207, 407, 507, 607: inverter
209, 409, 509, 609: LC filter
211, 411, 511, 611: transformer
213, 413, 513, 613: ringing removal unit
215, 415, 515, 615: signal controller
217, 417, 517, 617: indicator
421, 521, 621: ignition module
423, 523, 623: operation module
425, 525, 625: selector

What is claimed is:

1. An RF generator comprising:
a rectifier configured to rectify an AC voltage of a commercial power supply into a DC voltage and output the DC voltage;
a DC/DC converter configured to convert the DC voltage outputted from the rectifier into a second DC voltage;
an inverter including first and second switching elements controlled by a PWM control signal and operating alternately, and configured to convert a DC voltage having a predetermined level outputted from the DC/DC converter into an AC voltage having a predetermined level;
an LC filter including an inductor and capacitors coupled in series and parallel at an output terminal of the inverter, and configured to output a sine wave resonance signal having a predetermined resonance frequency from a high frequency signal outputted from the inverter;
a transformer configured to induce a high frequency power signal of a pulse waveform outputted from the LC filter to a secondary side;
an ignition module configured to terminate an ignition mode when a high frequency load detection current is larger than an ignition load setting current stored as a constant value in the ignition module, set a first switching frequency at the termination of the ignition mode as an ignition mode escape frequency, and output a mode selection signal and a switching frequency;
an operation module configured to apply the ignition mode escape frequency, which is outputted from the ignition module, as an initial value of a second switching frequency in an operation mode;
a signal controller configured to generate the PWM control signal by using the first switching frequency and the second switching frequency; and
a selector configured to select the switching frequency outputted from the ignition module in the ignition mode and select the second switching frequency outputted from the operation module in the operation mode by being controlled by the mode selection signal at the termination of the ignition mode.

2. The RF generator of claim 1, further comprising:
a ringing removal unit connected in parallel to the secondary side of the transformer, and configured to remove a ringing phenomenon occurring in a high frequency load current waveform due to a resonance phenomenon of a leakage inductance component existing on the secondary side of the transformer and a parasitic capacitance component parasitic to a high frequency load.

3. The RF generator of claim 2, wherein the ringing removal unit is composed of a capacitor.

4. The RF generator of claim 1, wherein the ringing removal unit is composed of a resistor and a capacitor connected in series.

5. The RF generator of claim 3, wherein the signal controller receives the high frequency load detection current and outputs a state signal to display a state of the high frequency load detection current, and
the RF generator further comprises:
an indicator configured to display the state of the high frequency load detection current in response to the state signal.

6. The RF generator of claim 1, wherein the ignition module compares the high frequency load detection current detected at a high frequency load side with the ignition load setting current, compares a high frequency load detection voltage detected at the high frequency load side with an ignition load setting voltage when the high frequency load detection current is smaller than the ignition load setting current, terminates the ignition mode and sets the first switching frequency at the termination of the ignition mode as the ignition mode escape frequency when the high frequency load detection current is equal to or larger than the ignition load setting current, reduces the first switching frequency by a predetermined frequency when the high frequency load detection voltage is smaller than the ignition load setting voltage, and maintains the first switching frequency as is when the high frequency load detection voltage is larger than the ignition load setting voltage, and
the operation module applies the ignition mode escape frequency as the initial value of the second switching frequency in the operation mode.

* * * * *